United States Patent
Li et al.

(10) Patent No.: US 6,392,474 B1
(45) Date of Patent: May 21, 2002

(54) CIRCUIT FOR FILTERING SINGLE EVENT EFFECT (SEE) INDUCED GLITCHES

(75) Inventors: Bin Li, Fairfax; Dave C. Lawson, Hartwood; Joseph Yoder, Oakton, all of VA (US)

(73) Assignee: BAE Systems Information and Electronic Systems Integration Inc., Rockville, MD (US)

( * ) Notice: Subject to any disclaimer, the term of this patent is extended or adjusted under 35 U.S.C. 154(b) by 53 days.

(21) Appl. No.: 09/651,156

(22) Filed: Aug. 30, 2000

Related U.S. Application Data
(60) Provisional application No. 60/152,348, filed on Sep. 7, 1999.

(51) Int. Cl.[7] .................................................. H03K 5/00
(52) U.S. Cl. ........................ 327/551; 327/208; 327/210
(58) Field of Search ........................... 327/57, 199, 200, 327/208, 210–212, 215, 219, 551, 552

(56) References Cited
U.S. PATENT DOCUMENTS

| | | | |
|---|---|---|---|
| 3,970,944 A | | 7/1976 | Huellwegen |
| 4,233,525 A | | 11/1980 | Takahashi et al. |
| 4,970,407 A | * | 11/1990 | Patchen ...................... 327/203 |
| 5,111,429 A | | 5/1992 | Whitaker |
| 5,175,605 A | | 12/1992 | Pavlu et al. |
| 5,184,032 A | | 2/1993 | Leach |
| 5,289,060 A | | 2/1994 | Elnashar et al. |

(List continued on next page.)

FOREIGN PATENT DOCUMENTS

| JP | 56-32824 A | 2/1981 |
|---|---|---|
| JP | 61-184006 A | 8/1986 |
| JP | 1-47120 A | 2/1989 |
| JP | 08242153 | 9/1996 |
| JP | 10294652 | 11/1998 |

OTHER PUBLICATIONS

Digital–Pulse Filter and Delay, IBM Technical Disclosure Bulletin, vol. 18, No. 9, Feb. 1976, p. 2755, L.G. Walewski.

Glitchlss Coincidence Latch, IBM Technical Disclosure Bulletin, vol. 18, No. 3, Aug. 1975, p. 748, J.A. Dorler.

*A Low–Cost Time Counter for Direct Flowmeter Calibration bythe Soap Film Method*, Design Notes, Control and Instrumentation, Feb. 1977, p. 11.

On–Chip Receiver Featuring Fall–Through Radiation–Hardened Latching, IBM Technical Disclosure Bulletin, vol. 32, No. 12, May 1990, pp. 389–392.

*Primary Examiner*—Kenneth B. Wells
(74) *Attorney, Agent, or Firm*—Antony P. Ng; Bracewell & Patterson, L.L.P.

(57) ABSTRACT

A circuit for filtering single event effect (SEE) induced glitches is disclosed. The circuit for filtering SEE induced glitches comprises an SEE immune latch circuit and a delay element. The SEE immune latch circuit includes a first input, a second input, and an output. The SEE immune latch changes from one state to another state only upon having incoming input signals of identical polarity being applied contemporaneously at both the first input and the second input. The first input of the SEE immune latch circuit is directly connected to a signal input, and the second input of the SEE immune latch circuit is connected to the signal input via the delay element. The delay element provides a signal delay time equal to or greater than a pulse width of an SEE induced glitch but less than a pre-determined pulse width of an incoming signal at the signal input under normal operation. By connecting the delay element between the signal input and the second input of the SEE immune latch circuit, a temporal separation greater that the duration of an SEE induced glitch can be achieved on the data being drive into the first and the second inputs of the SEE immune latch circuit. As a result, SEE induced glitches will not be written into the SEE immune latch circuit.

10 Claims, 4 Drawing Sheets

U.S. PATENT DOCUMENTS

| | | |
|---|---|---|
| 5,311,070 A | 5/1994 | Dooley |
| 5,406,513 A | 4/1995 | Canaris et al. |
| 5,418,486 A | 5/1995 | Callahan |
| 5,440,178 A | 8/1995 | McClure |
| 5,504,703 A | 4/1996 | Bansal |
| 5,539,337 A | 7/1996 | Taylor et al. |
| 5,559,461 A | 9/1996 | Yamashina et al. |
| 5,760,612 A | 6/1998 | Ramirez |
| 5,764,089 A * | 6/1998 | Partovi et al. .............. 327/208 |
| 5,870,332 A | 2/1999 | Lahey et al. |
| 6,111,444 A * | 8/2000 | Mikan, Jr. et al. .......... 327/208 |

* cited by examiner

CIRCUIT FOR FILTERING SINGLE EVENT EFFECT (SEE) INDUCED GLITCHES

REFERENCE TO RELATED APPLICATIONS

The present application is related to a provisional application, Ser. No. 60/152,348, filed on Sep. 7, 1999, the contents of which are incorporated by reference herein.

BACKGROUND OF THE INVENTION

1. Technical Field

The present invention relates to integrated circuits in general, and in particular to filter circuits. Still more particularly, the present invention relates to a circuit for filtering single event effect induced glitches.

2. Description of the Prior Art

In digital systems, signals on a signal line are transmitted at two voltage levels, namely, a logical "0" (low voltage level) and a logical "1" (high voltage level). A transition from a logical "0" to a logical "1" and then back to a logical "0" on a signal line signifies a pulse on the signal line. The duration in time between the two transitions is commonly referred to as a pulse width. Sometimes, noise and/or unsynchronized circuit operations, typically known as glitches, may cause unexpected transitions on the signal line. A glitch, as used herein, is defined as any pulse present on a signal line having a pulse width less than a pre-determined pulse width. For example, if a digital system designed to have a signal line carries signals with pulses of at least n nanoseconds in width, any pulse having a width of less than n nanoseconds may be considered a glitch. Furthermore, a glitch may correspond to a high or low voltage spike or to an unexpected transition from the current voltage level to the opposite level and back again. to an unexpected transition from the current voltage level to the opposite level and back again.

In addition to noise and/or unsynchronized circuit operations, a single event effect (SEE) can also cause glitches. An SEE is the result of an ion transitioning through a semiconductor structure and depositing charges on a critical circuit node within that semiconductor structure. Generally, SEE can occur when a cosmic particle strikes a combinational logic node, and a voltage glitch of about 100 ps to 300 ps may be generated at the combinational logic node as a result. The voltage glitch then propagates through many combinational logic gates to a latch, which may cause the stored data within the latch to be corrupted if the glitch propagates to the input of the latch at the edge of a clock signal. This problem becomes more prevalent as the critical dimensions of transistors become smaller and smaller.

Known SEE hardening techniques for complementary-metal-oxide semiconductor (CMOS) processing technology include the usage of redundancy on combinational logic circuits and the usage of cross-coupled resistors or capacitors on storage cells. Redundancy typically includes at least two separate and independent circuits and a voting scheme to reduce the effect of SEEs. Added cross-coupled resistors and capacitors in a storage cell can slow down the ability of the storage cell to latch false data. However, each of the above-mentioned techniques has its drawbacks. For example, a typical voting scheme uses digital logic to recombine the redundant paths, and thereby actually provides amplification of SEEs. Also, the added cross-coupled resistors and capacitors in a storage cell introduce a more complicated fabrication process and results in a slower response to all input signals, thereby decreasing the operating speed of the storage cell. Consequently, it would be desirable to provide a better SEE hardening technique for removing glitches in digital logic circuits.

SUMMARY OF THE INVENTION

In accordance with a preferred embodiment of the present invention, a circuit for filtering single event effect (SEE) induced glitches comprises an SEE immune latch circuit and a delay element. The SEE immune latch circuit includes a first input, a second input, and an output. The SEE immune latch changes from one state to another state only upon having incoming input signals of identical polarity being applied contemporaneously at both the first input and the second input. The first input of the SEE immune latch circuit is directly connected to a signal input, and the second input of the SEE immune latch circuit is connected to the signal input via the delay element. The delay element provides a signal delay time equal to or greater than a pulse width of an SEE induced glitch but less than a pre-determined pulse width of an incoming signal at the signal input under normal operation. By connecting the delay element between the signal input and the second input of the SEE immune latch circuit, a temporal separation greater that the duration of an SEE induced glitch can be achieved on the data being drive into the first and the second inputs of the SEE immune latch circuit. As a result, SEE induced glitches will not be written into the SEE immune latch circuit.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The present invention is illustrated with complementary-metal-oxide semiconductor (CMOS) integrated circuits, though other types of processing technology may also be applicable.

Figure 1:
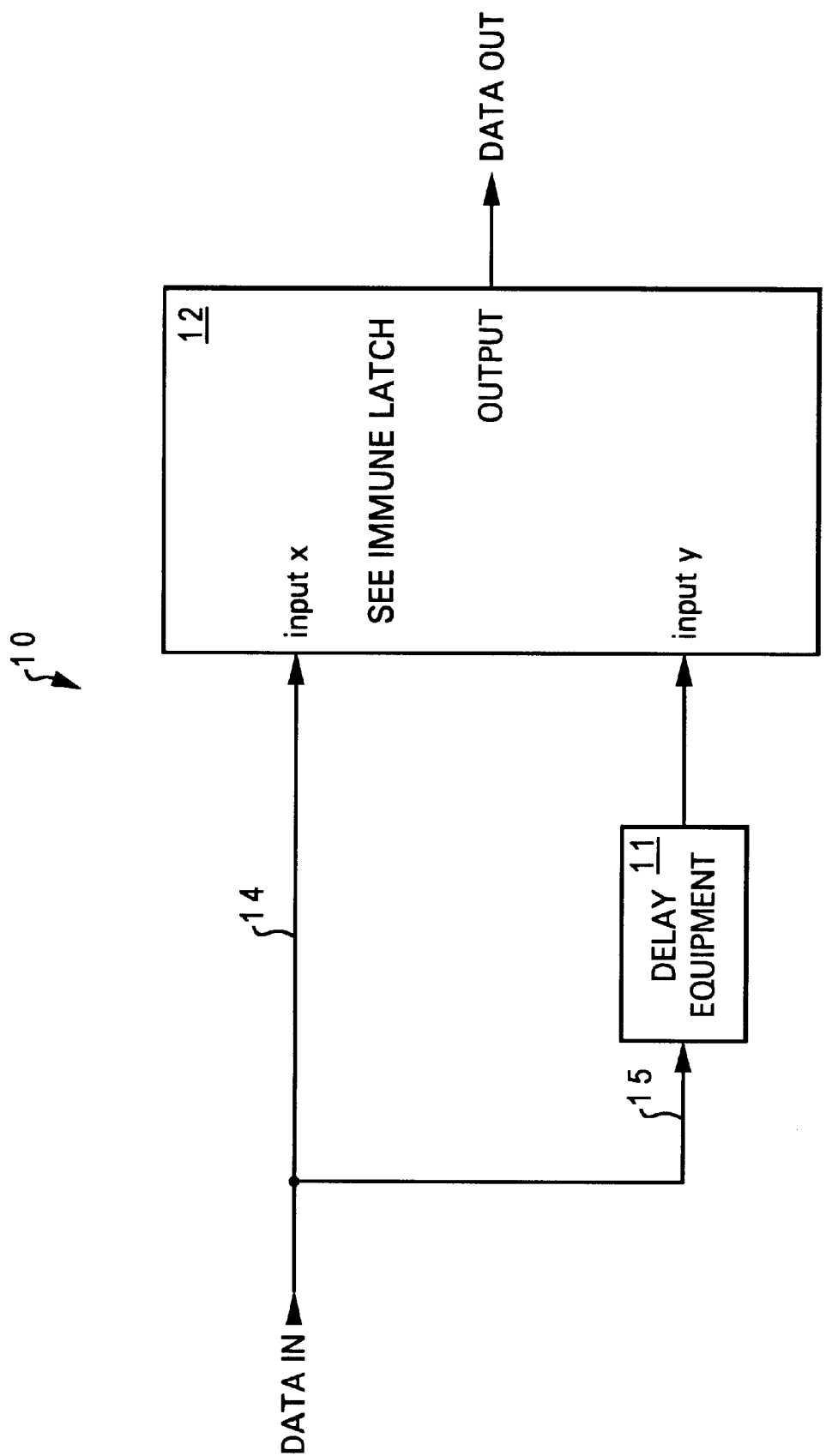
FIG. 1 is a block diagram of a circuit for filtering single event effect induced glitches, in accordance with a preferred embodiment of the present invention.

Referring now to the drawings and in particular to FIG. 1, there is illustrated a block diagram of a circuit for filtering single event effect (SEE) induced glitches, in accordance with a preferred embodiment of the present invention. As shown, a filter circuit 10 includes a delay element 11 and an SEE immune latch 12. SEE immune latch 12 includes an input x, an input y, and an output. A DATA IN signal input is preferably divided into two signal paths, namely, a non-delayed signal path 14 and a delayed signal path 15. Non-delay signal path 14 is directly connected to input x of SEE immune latch 12, and delay signal path 15 is connected to input y of SEE immune latch 12 via delay element 11.

An important characteristic of SEE immune latch 12 is that the state of SEE immune latch 12 only changes when signals on both input x and input y have the same polarity. In addition, the delay time of delay element 11 is adjusted such that a glitch or transient disturbance occurred at DATA IN signal input does not appear at both input x and input y simultaneously. In other words, when an SEE induced glitch occurs at the DATA IN input, the SEE induced glitch will arrive at input x and input y at a different time because the propagation time is different between non-delayed signal path 14 and delayed signal path 15. As a result, the state of SEE immune latch 12 remains the same even after an SEE induced glitch. Thus, in conjunction with delay element 11, SEE immune latch 12 allows filter circuit 10 to filter out any SEE induced glitches occurred at DATA IN signal input.

It is important to provide an appropriate delay time for delay element 11. In order to achieve the best result, the delay time for delay element 11 is preferably set to equal to or greater than the pulse width of an SEE induced glitch but less than the pre-determined pulse width of a signal under normal operation.

Figure 2:
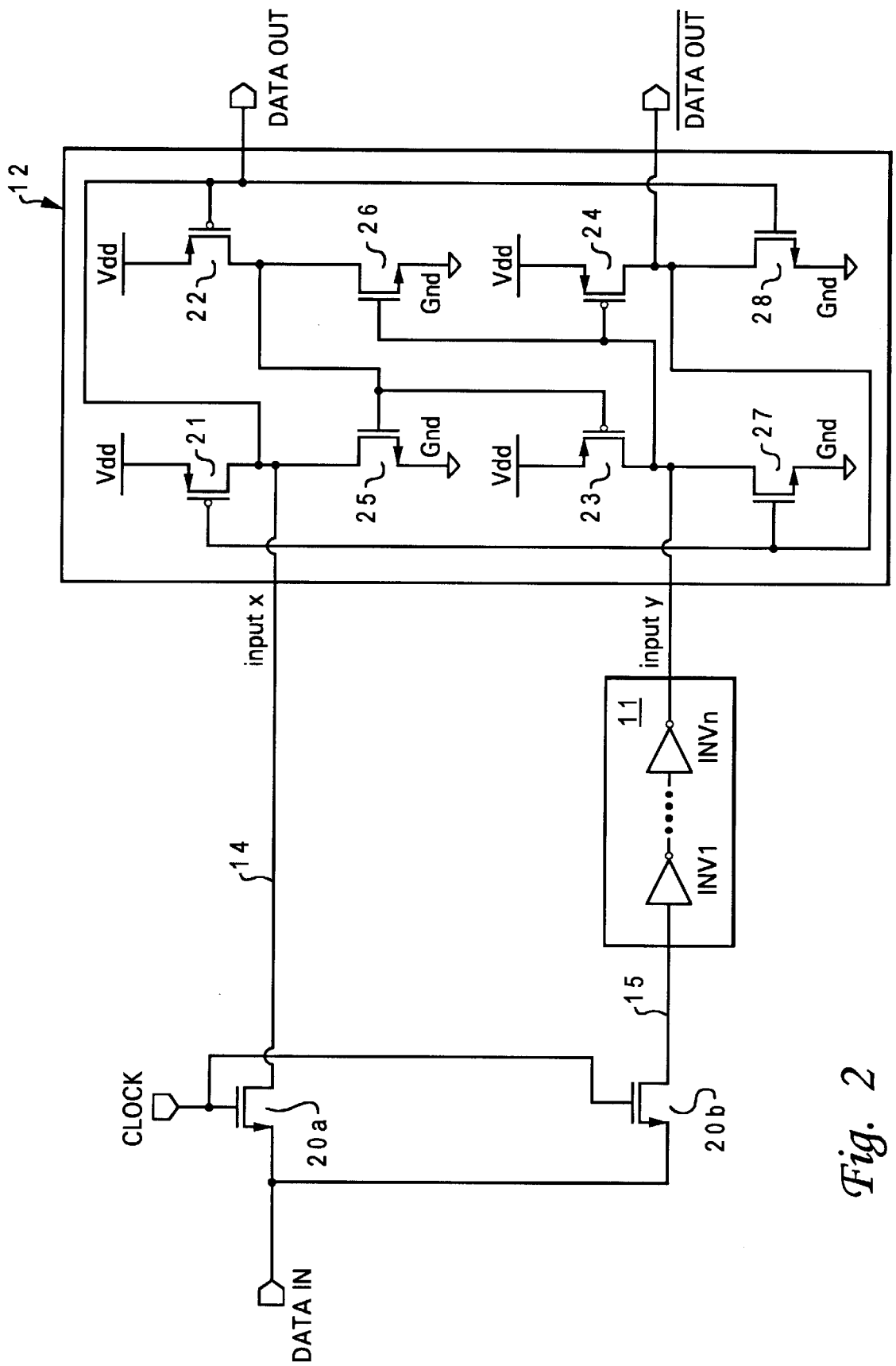
FIG. 2 is a schematic circuit diagram of the circuit from FIG. 1, in accordance with a preferred embodiment of the present invention.

With reference now to FIG. 2, there is illustrated a schematic circuit diagram of filter circuit 10 from FIG. 1, in accordance with a preferred embodiment of the present invention. As shown, SEE immune latch 12 includes p-channel transistors 21-24 and n-channel transistors 25-28. Transistors 21 and 25 are connected in series, transistors 22 and 26 are connected in series, transistors 23 and 27 are connected in series, and transistors 24 and 28 are connected in series. The node between transistors 22 and 26 is connected to the gates of transistors 23 and 25. The node between transistors 23 and 27 is connected to the gate of transistors 24 and 26. The node between transistors 24 and 28 is connected to the gates of transistors 21 and 23. The node between transistors 21 and 25 serves as the input x for SEE immune latch 12, and the node between transistors 23 and 27 serves as the input y for SEE immune latch 12. In addition, the node between transistors 21 and 25 also serves as the DATA OUT output for SEE immune latch 12. A complement of DATA OUT (i.e., *DATA OUT) output can be obtained via the node between transistors 24 and 28.

As shown in FIG. 2, a single DATA IN signal input is divided into non-delayed signal path 14 and delayed signal path 15. Both non-delayed signal path 14 and delayed signal path 15 are controlled by a clock via n-channel transistors 20a and 20b, respectively. For non-delayed signal path 14, DATA IN input signals are fed directly (via transistor 20a) into input x of SEE immune latch 12. For delayed signal path 15, DATA IN input signals are fed into input y of SEE immune latch 12 via delay element 11. In this implementation, delay element 11 includes several inverters, INV1 to INVn, where n is an odd number, connected in series. The number of inverters is preferably determined by the width of SEE induced glitches.

As mentioned previously, SEE immune latch 12 only changes state upon having same input signals being applied contemporaneously at input x and input y. IF an SEE induced glitch occurs at the DATA IN signal input, the glitch will arrive at input x and input y of SEE immune latch 12 at a different time because the glitch on delayed signal path 15 takes longer to reach input y than the glitch on non-delayed signal path 14 to reach input x. As a result, the SEE induced glitch is filtered out because the state of SEE immune latch 12 remains the same after the SEE.

Figure 3:
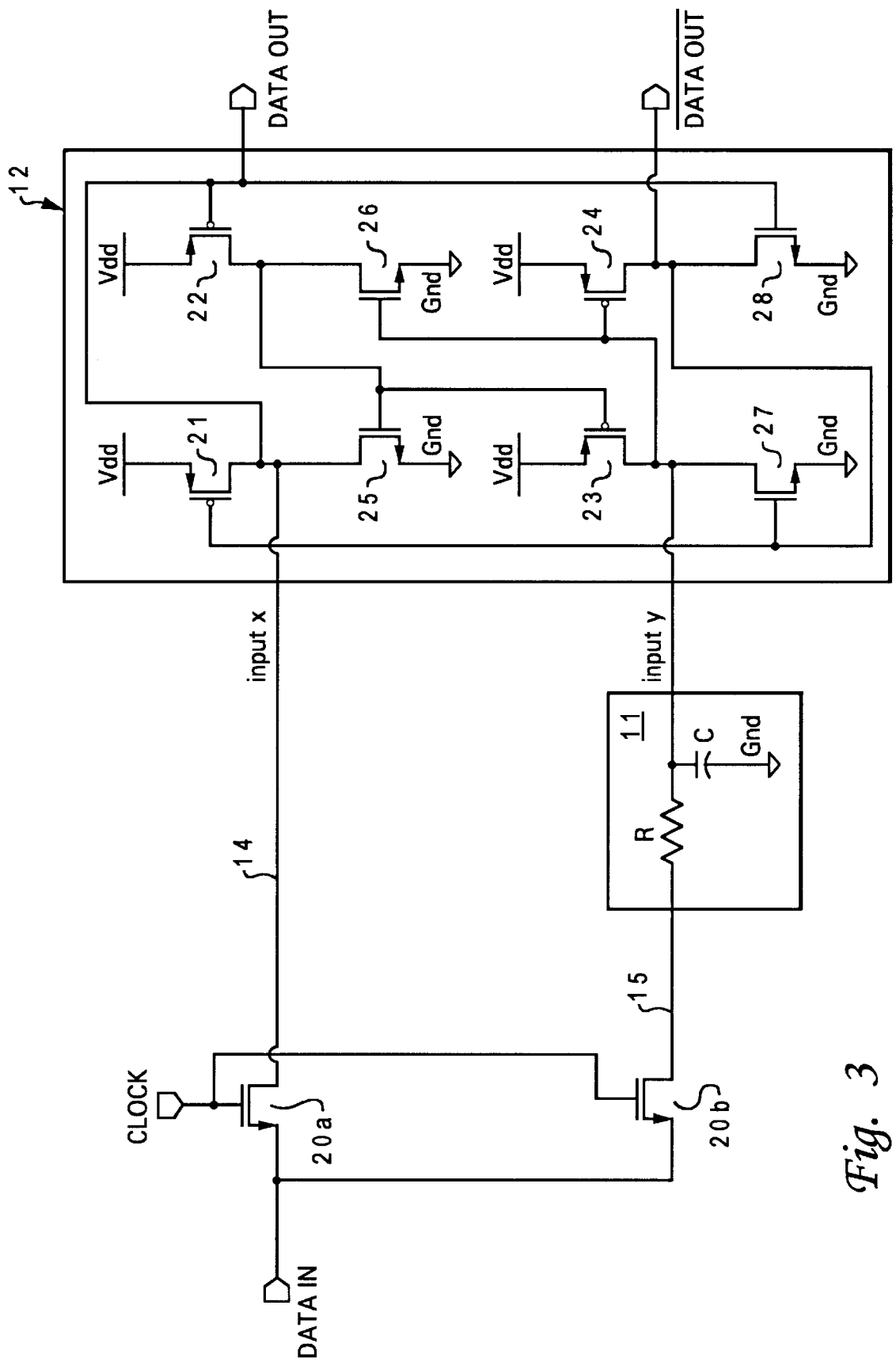
FIG. 3 is a schematic circuit diagram of the circuit from FIG. 1, in accordance with an alternative embodiment of the present invention.

Referring now to FIG. 3, there is illustrated a schematic circuit diagram of filter circuit 10 from FIG. 1, in accordance with an alternative embodiment of the present invention. As shown, SEE immune latch 12 includes p-channel transistors 21-24 and n-channel transistors 25-28, arranged in the same configuration as shown in FIG. 2. However, in this embodiment, delay element 11 is implemented with a resistors R and capacitor C connected in a low-pass filter configuration. Again, if an SEE induced glitch occurs at the DATA IN input, the glitch will arrive at input x and input y of SEE immune latch 12 at a different time because the glitch on delayed signal path 15 takes longer to reach input y than the glitch on non-delayed signal path 14 to reach input x. As a result, the SEE induced glitch is filtered out because the state of SEE immune latch 12 remains the same after the SEE.

Figure 4:
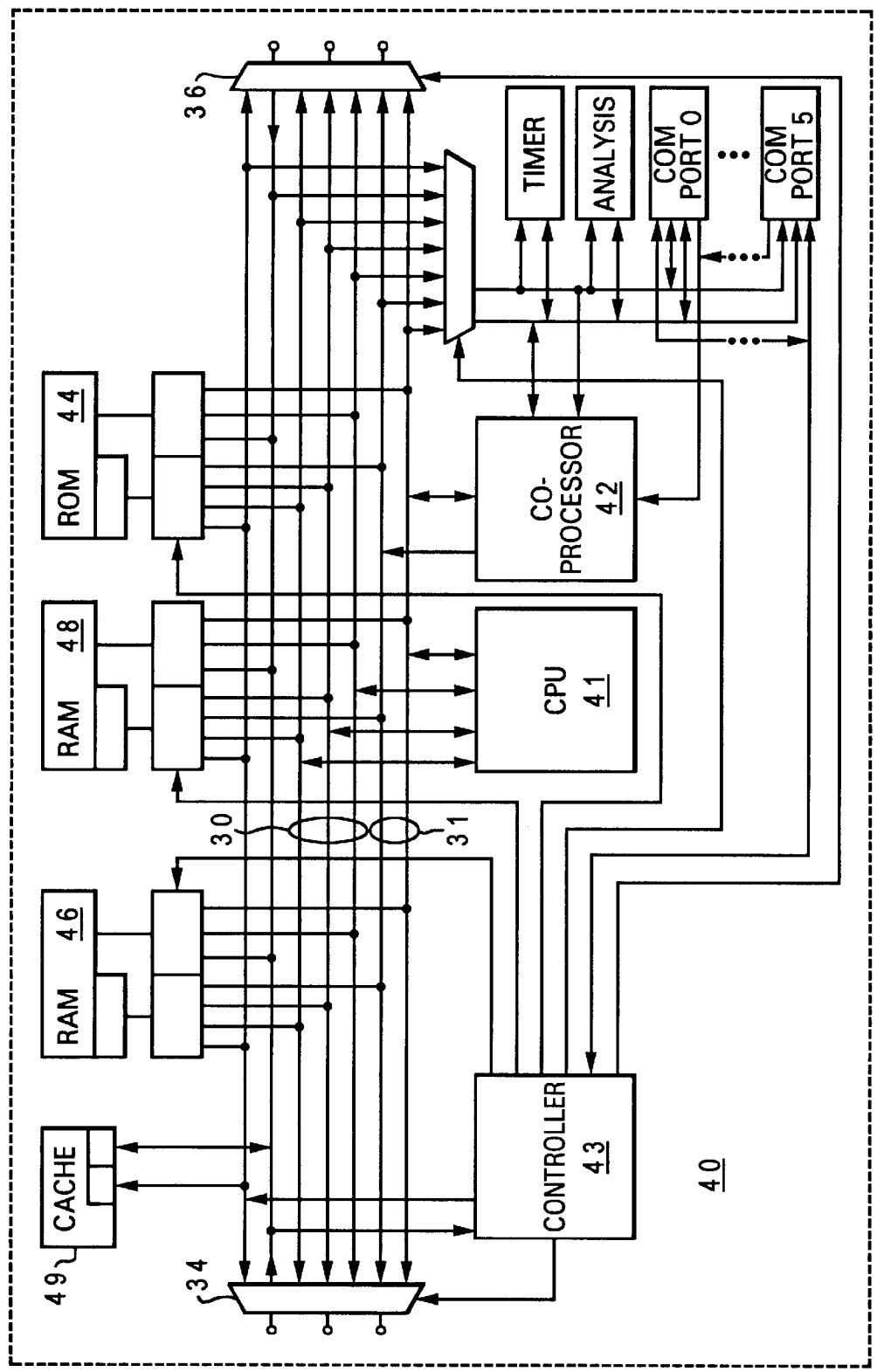
FIG. 4 is a block diagram of a processor in which the circuit from FIG. 1 can be implemented in accordance with a preferred embodiment of the present invention.

With reference now FIG. 4, there is illustrated a block diagram of a processor in which filter circuit 10 from FIG. 1 can be implemented in accordance with a preferred embodiment of the present invention. As shown, processor 40 includes a central processing unit (CPU) 41, a coprocessor 42, and a controller 43. Processor 40 further includes a read-only memory (ROM) 44 and random access memories (RAMs) 46, 48. External connection for processor 40 is made by way of peripheral ports 34 and 36 that multiplex various bus signals onto external terminals of processor 40. Peripheral ports 34 and 36 provide special purpose signals for communication to devices external to processor 40. Data bus 30 contains a set of data lines that communicate data signals among memories 44, 46, 48, peripheral ports 34, 36, and CPU 41. Address bus 31 contains a set of address lines that communicate address signals among CPU 41, peripheral ports 34, 36, and memories 44, 46, 48. Instruction cache 49 is a small high-speed memory that retains most recently used instructions such that the retrieval time for repetitively used instructions can be reduced. Filter circuit 10 from FIG. 1 can be applied to data bus 30 and/or address bus 31 within processor 40. Preferably, filter circuit 10 from FIG. 1 is inserted within each of the data lines of data bus 30 and/or each of the address lines of address bus 31 such that any SEE induced glitches occurred on those buses can be eliminated.

As has been described, the present invention provides a circuit for filtering SEE induced glitches. With the present invention, any SEE induced glitches can be eliminated from a data bus and/or an address bus of a digital logic circuit. In FIG. 1, although delay element 11 is shown to be placed between clock-controlled transistor 20b and input y, delay element 11 can also be placed between the DATA IN input and clock-controlled transistor 20b. By applying delay element 11 to the DATA IN signal input, a temporal separation greater than the duration of a single event effect generated glitch can be achieved on the data being driven into inputs x and y in this implementation, whereby single event effect pulses will not be written into SEE immune latch 12.

While the invention has been particularly shown and described with reference to a preferred embodiment, it will be understood by those skilled in the art that various changes in form and detail may be made therein without departing from the spirit and scope of the invention.

What is claimed is:

1. A filter circuit for filtering noise induced glitches, said filter circuit comprising:

a filter input;

a filter output;

a noise immune latch circuit having a first input, a second input, and an output, wherein said first input is connected to said filter input, wherein said output is connected to said filter output, wherein said noise immune latch circuit changes from one state to another state only when input signals of identical polarity are contemporaneously received by both said first input and said second input; and a delay element connected between said filter input and said second input of said noise immune latch circuit, wherein said delay element provides a signal delay time equal to or greater than a pulse width of a noise induced glitch but less than a pre-determined pulse width of an incoming signal at said filter input during operations.

2. The filter circuit according to claim 1, wherein said delay element includes a plurality of inverters connected in series.

3. The filter circuit according to claim 1, wherein said delay element includes a resistor and a capacitor connected in a low-pass filter configuration.

4. The filter circuit according to claim 1, wherein said noise immune latch circuit includes a plurality of transistors connected in a cross-coupled configuration.

5. An integrated circuit comprising:

circuitry operative in response to a clock signal having transitions, wherein said circuitry includes a plurality of buses that are potentially subject to noise induced glitches; and a filter circuit inserted with each of said plurality of buses, wherein said filter circuit includes:

a filter input;

a filter output;

a noise immune latch circuit having a first input, a second input, and an output, wherein said first input is connected to said filter input, wherein said output is connected to said filter output, wherein said noise immune latch circuit changes from one state to another state only when input signals of identical polarity are contemporaneously received by both said first input and said second input; and a delay element connected between said filter input and said second input of said noise immune latch circuit, wherein said delay element provides a signal delay time equal to or greater than a pulse width of a noise induced glitch but less than a predetermined pulse width of an incoming signal at said filter input during operations.

6. The integrated circuit according to claim 5, wherein said delay element includes a plurality of inverters connected in series.

7. The integrated circuit according to claim 5, wherein said delay element includes a resistor and a capacitor connected in a low-pass filter configuration.

8. The integrated circuit according to claim 5, wherein said noise immune latch circuit includes a plurality of transistors connected in a cross-coupled configuration.

9. The integrated circuit according to claim 5, wherein said plurality of buses are data buses.

10. The integrated circuit according to claim 5, wherein said plurality of buses are address buses.

* * * * *